United States Patent [19]
Nakamura

[11] Patent Number: 5,290,716
[45] Date of Patent: Mar. 1, 1994

[54] METHOD OF MANUFACTURING SEMICONDUCTOR DEVICES

[75] Inventor: Shunji Nakamura, Kawasaki, Japan

[73] Assignee: Fujitsu Limited, Kawasaki, Japan

[21] Appl. No.: 87,352

[22] Filed: Jul. 8, 1993

Related U.S. Application Data

[62] Division of Ser. No. 911,746, Jul. 10, 1992.

[30] Foreign Application Priority Data

Jul. 12, 1991 [JP] Japan .................. 3-172697

[51] Int. Cl.⁵ .......................................... H01L 21/265
[52] U.S. Cl. .......................... 437/31; 437/40; 148/DIG. 11
[58] Field of Search .......... 437/31, 40, 6, 909; 148/DIG. 10, DIG. 11

[56] References Cited
U.S. PATENT DOCUMENTS

| | | | |
|---|---|---|---|
| 4,545,114 | 10/1985 | Ito et al. | 437/31 |
| 4,640,721 | 2/1987 | Uehara et al. | 437/31 |
| 4,731,341 | 3/1988 | Kamakatsu | 437/31 |
| 4,746,629 | 5/1988 | Hamagasaki | 437/31 |
| 5,008,207 | 4/1991 | Blouse et al. | 437/31 |
| 5,024,957 | 6/1991 | Harame et al. | 437/31 |
| 5,039,624 | 8/1991 | Kadota | 437/31 |

FOREIGN PATENT DOCUMENTS

| | | | |
|---|---|---|---|
| 0107572 | 6/1984 | Japan | 437/31 |
| 0040921 | 2/1990 | Japan | 437/31 |

Primary Examiner—Brian Hearn
Assistant Examiner—Tuan Nguyen
Attorney, Agent, or Firm—Staas & Halsey

[57] ABSTRACT

Semiconductor devices having a reduced parasitic capacitance while having a maximum acceptable current similar to those of prior devices, and a method of manufacturing thereof are disclosed. The inventive device has a hole at the bottom of which an insulating film separated from the hole walls is located, a semiconductor film being present in the hole, which is connected to the semiconductor substrate adjacent to the insulating film and a conductor film constituting a portion of the hole wall, and extends onto the insulating film so as to cover at least part of the film.

4 Claims, 13 Drawing Sheets

METHOD OF MANUFACTURING SEMICONDUCTOR DEVICES

This application is a division, of presently pending application Ser. No. 07/71,746, filed Jul. 10, 1992.

BACKGROUND OF THE INVENTION

1. Field of the Invention

The invention relates to semiconductor devices and a method of manufacturing thereof, and more particularly, relates to semiconductor devices including those such as self-aligned bipolar transistors and field effect transistors (FETs), and a method of manufacturing thereof.

2. Description of the Related Art

Recently, in such a field of computers, higher speed information processing has been required. Accordingly, semiconductor integrated circuit devices used in the field are also required to have a higher speed.

Bipolar transistors are used as high speed semiconductor devices, e.g., in computers. An advanced, self-aligned bipolar transistor, which is expected to have high speed information processing, is disclosed in JP-A-62-183558. This bipolar transistor is made as follows:

Referring to FIG. 1, collector contact n-type regions 5 are selectively formed in a p-type semiconductor substrate 1, on the surface of which a buried $n^+$-type layer 2 and an epitaxial layer 3 have been formed, to thereby contact the buried layer 2. Insulating regions 8 for isolation are then selectively formed in given areas of the substrate 1.

Subsequently, a lower insulating film 9, a polysilicon film 10 doped with p-type impurities for base electrodes, and an upper insulating film 11 are formed in order, after which holes 12 are formed that go through said three layers of film and reach the epitaxial layer 3 adjacent to the collector contact regions 5.

Polysilicon films 45 for forming the base electrode are then selectively formed on the sides of the hole 12. By the subsequent heat treatment, p-type impurities are doped from the polysilicon film 10 having been doped with the p-type impurities into the epitaxial layer 3 through the polysilicon film 45 on the side of the hole 12, to thereby form a doughnut-like external base region 13. P-type impurities are then ion-implanted inside the doughnut-like external base region 13 to thereby form an internal base region 14.

Subsequently, side walls 15 of insulation film covering the polysilicon film 45 are formed on the sides of the hole 12, to thus newly form a hole 16 inside the old hole 12. A polysilicon film doped with n-type impurities is then formed, covering the hole 16, and patterned, to thereby form an emitter electrode 17. By the subsequent heat treatment, n-type impurities are doped from the hole 16, to thereby form an emitter region 18 inside the internal base region 14.

A contact hole 19 is formed in the insulating films on the collector contact region 5, and a via-hole 44 in the insulating film on the base electrode 10. Metallic emitter, base, and collector electrodes 20, 21, and 22 are then formed by aluminum, to thus complete a self-aligned bipolar transistor.

To achieve a higher speed in such a bipolar transistor, it is necessary to form the device in such a manner that the areas of a base region, consisting of external and internal base regions 13 and 14, and an emitter region 18 are as small as possible, to thereby reduce the parasitic capacitances of a base/collector junction and a base/emitter junction.

It is also necessary to form a thin internal base region 14 in order to provide high speed prior bipolar transistors. However, when the internal base region 14 is thin, the base resistance just under the unit is high, and the so-called emitter crowding effect occurs, in which the collector current passes only at the peripheral portion of the emitter region 18 and does not pass inside the region 18, because the inside region has a higher base resistance than that of the outside region. Although the inside of the emitter region 18 scarcely participates the operation of the transistor, the parasitic capacitance preventing high speed operation remains. On the other hand, a parasitic capacitance between a base and a collector or a base and an emitter prevents high speed operation of a high speed bipolar transistor because of the charge and discharge of the parasitic capacitance. Thus, the internal base region does not participate the operation of the bipolar transistor, and the junction parasitic capacitance in the internal base region prevents the high speed operation of the bipolar transistor, and accordingly, it is preferred that the portion of the internal base region does not exist. Namely, to produce a high speed bipolar transistor, it is preferred that a base is formed only in a region adjacent to an emitter, the region being close to a base electrode, i.e., having a low base resistance.

In the above method of manufacturing, although the internal base region 14 is formed by ion implantation, the shallower implantation of conductive impurities is very difficult because of channeling. The formation of a shallow internal base region 14 has therefore limitations.

SUMMARY OF THE INVENTION

It is an object of the present invention to provide semiconductor devices capable of reducing parasitic capacitance to make the processing speed of the transistor higher, while having a maximum acceptable current similar to that of prior devices, and a method of manufacturing thereof.

The semiconductor device and the method of the present invention are delineated, including preferred embodiments thereof, as follows:

1. A semiconductor device comprising a hole that goes through three layers of a first insulating film formed on a semiconductor substrate, a first conductor film formed on the first insulating film, and a second insulating film formed on the first conductor film, and reaches the substrate; a third insulating film that is located on the semiconductor substrate at the bottom of the hole and separated from the inside walls of the hole; a semiconductor film that is connected to the first conductor film in the inside wall of the hole and the semiconductor substrate between the third insulating film and the inside wall of the hole, and extends onto the third insulating film; a fourth insulating film covering the inside wall of the hole and the semiconductor film; and a second conductor film that is connected to a part of the semiconductor film.

2. The semiconductor device of the above item 1, wherein the semiconductor substrate is a type of conduction, a region of the semiconductor film being connected to the second conductor film is the same type of conduction as that of the substrate, and a region of the semiconductor film connected to the semiconductor substrate is the opposite type of conduction, and said region of the semiconductor film connected to the semiconductor substrate is a base region.

3. The semiconductor device of the above item 1, wherein the semiconductor substrate is a type of conduction, a region of the semiconductor film connected to the first conductor film is the same type of conduction as that of the substrate, and a region of the semiconductor film connected to the semiconductor substrate is the opposite type of conduction, and said region of the semiconductor film connected to the substrate is a base region.

4. The semiconductor device of the above item 1, wherein the semiconductor substrate is a type of conduction; a region of the semiconducts film connected to the first conductor film is the opposite type of conduction; a region of the semiconductor film connected to the second conductor film is the opposite type of conduction; and a region of the semiconductor film connected to the semiconductor substrate is the same type of conduction as that of the substrate, and said region of the semiconductor film connected to the substrate is a base region.

5. The semiconductor device of the above item 1, wherein the semiconductor substrate is a type of conduction; a region of the semiconductor film connected to the first conductor film is the opposite type of conduction, a region of the semiconductor film connected to the second conductor film is the same type of conduction as that of the substrate; and a region of the semiconductor film connected to the semiconductor substrate is the same type of conduction as that of the substrate, and said region of the semiconductor film connected to the semiconductor substrate is a channel region.

6. The semiconductor device of the above item 1, wherein the semiconductor substrate is a type of conduction; a region of the semiconductor film connected to the first conductor film is the same type of conduction as that of the substrate; a region of the semiconductor film connected to the second conductive film is the opposite type of conduction; and a region of the semiconductor film connected to the semiconductor substrate is the same type of conduction as that of the substrate, and said region of the semiconductor film connected to the substrate is a channel region.

7. The semiconductor device of the above item 1, wherein the semiconductor substrate is a type of conduction; a region of the semiconductor film connected to the first conductor film is the opposite type of conduction; a region of the semiconductor film connected to the second conductive film is the opposite type of conduction; and a region of the semiconductor film connected to the semiconductor substrate is the opposite type of conduction, and said region of the semiconductor film connected to the substrate is a channel region.

8. The semiconductor device of the above item 1, wherein the semiconductor substrate is a type of conduction; the semiconductor film is the same type of conduction as that of substrate, and is connected to the first conductor film of the opposite type of conduction through a gate insulation film and to the second conductor film of the same type of conduction as that of the substrate through a source or drain region formed of a portion of the semiconductor film; and a region of the semiconductor film connected to the semiconductor substrate is a channel region.

9. The semiconductor device of the above item 1, wherein the semiconductor substrate is a type of conduction; the semiconductor film is the same type of conduction as that of the substrate, and is connected to the second conductor film of the opposite type of conduction through a gate insulation film; a source or drain region is located at an intermediate portion of the semiconductor film between the substrate and the first conductor film of the same type of conduction as that of the substrate, and a region of the semiconductor film connected to the semiconductor substrate is a channel region.

10. The semiconductor device of the above item 1, wherein the semiconductor substrate is a type of conduction, the semiconductor film is the opposite type of conduction, and is connected to the substrate through a gate insulation film, and a region of the semiconductor film connected to the substrate through the insulation film is a channel region.

11. A method of manufacturing a semiconductor device, comprising the following steps:
on a semiconductor substrate surface at the bottom of a hole that goes through three layers of a first insulating film formed on the substrate, a first conductor film formed on the first insulating film, and a second insulating film formed on the first conductor film, and reaches the substrate surface, forming a third insulating film separated from the inside walls of the hole;
forming a semiconductor film covering the bottom of the hole and the first insulating and the first conductor films in the walls of the hole;
forming a fourth insulating film covering the inside walls of the hole in such a way that a part of the semiconductor film on the third insulating film is exposed; and
forming a second conductor film being connected to the exposed semiconductor film.

12. The method of the above item 11, comprising the following steps between the steps of forming the third insulating film and forming the semiconductor film:
forming a fifth insulating film on the surface of the first conductor film exposed on the inside wall of the hole and the surface of the semiconductor substrate adjacent to the third insulating film; and
removing the fifth insulating film on the surface of the semiconductor substrate adjacent to the third insulating film by an anisotropic etching.

13. The method of the above item 11, comprising the following steps after the step of forming the second hole:
etching and removing the exposed semiconductor film using the fourth insulating film as a mask; and
forming a second conductor film connected to the semiconductor film.

According to the invention, a semiconductor device has a third insulating film at the bottom of a hole and separated from the inside walls of the hole, and also has a semiconductor film that is connected to a first conductor film interposed between a first and a second insulating film in the inside wall and to the surface of a semiconductor substrate adjacent to the third insulating film, and is connected to a second conductor film on the third insulating film.

In the semiconductor device having such a constitution, the semiconductor film is used as a base or channel region, and a collector or drain current is passed between whichever two of the first conductor film, the semiconductor substrate adjacent to the third insulating film, or the second conductor film connected to the semiconductor film on the third insulating film.

Consequently, in the case of a bipolar transistor, the entire bottom of a hole that has determined the area of a collector/base junction in the prior transistor is not used as a collector/base junction in the semiconductor device of the present invention, i.e., the semiconductor substrate surface adjacent to the third insulating film, the side of the first conductor film in the inside wall of the hole, or the side of the semiconductor film connected to the second conductor film on the third insulating film is used as a place forming the collector/base junction, and therefore, the area of the collector/base junction is approximately equal to the surface area of the semiconductor substrate adjacent to the third insulating film, or the area corresponding to the thickness of the first conductor film or the semiconductor film. Also, since a place other than that used as the collector/base junction is used for an emitter/base junction, the area of the emitter/base junction is approximately equal to said surface area of the substrate or said area corresponding to the film thickness. The areas of collector/base junction and emitter/base junction can therefore be greatly reduced compared with the case of a prior device in which the area of junction such as a collector/base junction is determined by the entire bottom of the hole, and a parasitic capacitance can be reduced accordingly. In addition, although the emitter/base junction area in the device of the invention is small even when compared with the prior device, in which it is estimated that the entire emitter/base junction does not operate because of the emitter crowding effect, an acceptable maximum current in the device of the invention that operates in the entire junction is not reduced.

For static induction transistors (SITs) having a similar structure, a parasitic capacitance can also be reduced because of the possibility of making the structure more small, and it is possible to make high speed transistors because of the possibility of making a channel region shorter.

According to the method of manufacturing a semiconductor device of the present invention, a conjunction and a region are self-alignedly formed each without channeling because of ion implantation.

For example, when making a bipolar transistor, the base region between an emitter and a collector, which are constituted by a second conductor film over a third insulating film and a semiconductor substrate, is self-alignedly determined by the approximately thickness of the third insulating film and the width of a fourth insulating film hanging over the third insulating film; the base region between an emitter and a collector, which are formed by a first conductor film in the inside wall of a hole and a second conductor film over a third insulating film, is self-alignedly determined by the approximately thickness of a fourth insulating film and the thickness of a semiconductor film; and the base region between an emitter and a collector, which are constituted by a first conductor film in the inside wall of a hole and a semiconductor substrate, is self-alignedly determined by the approximately thickness of a first insulating film.

Also, a collector/base junction area and an emitter/base junction area are determined by the thickness of a semiconductor film, the thickness of a first conductor film, and the surface area of the semiconductor substrate adjacent to a third insulating film. When a collector/base junction or emitter/base junction is formed between the semiconductor substrate adjacent to a third insulating film and a semiconductor film, the base region is determined by the thickness of a metal or insulation film formed on the inside wall of a hole for forming the third insulating film.

Thus, the reduction of emitter, base, and collector regions, and the formation of a shallow junction can be easily carried out.

Furthermore, when a static induction transistor (SIT) is made according to the same method of manufacturing, which has a gate of a semiconductor film, a first conductor film, or a semiconductor substrate adjacent to a third insulating film, or has an insulation gate by forming a gate insulation film between a first conductor film, second conductor film, or semiconductor substrate adjacent to a third insulating film, and a semiconductor film, the reduction of each region and the shortening of a channel region can be easily carried out.

In the present invention, the semiconductor substrate may be a single substrate or a layer or film of a semiconductor formed on a separate substrate.

BRIEF DESCRIPTION OF THE DRAWINGS

The above and other objects and advantages of the present invention will be apparent from the following detailed description given with reference to the accompanying drawings, in which.

DESCRIPTION OF THE PREFERRED EMBODIMENTS

Referring to FIGS. 2A to 2H, the method of manufacturing a self-aligned bipolar transistor of an embodiment of the invention is described.

Figure 2A:
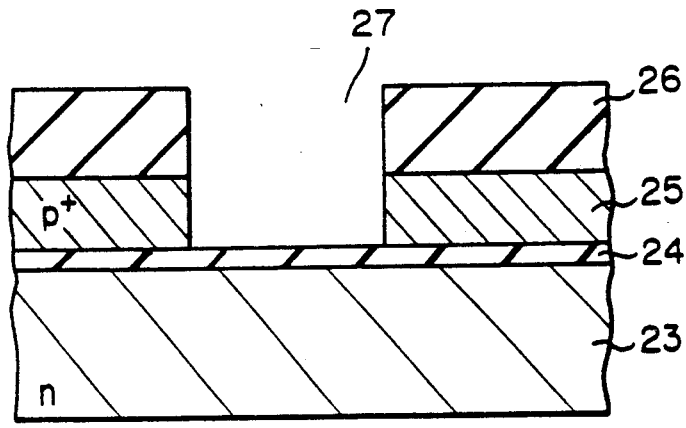
FIG. 2A to 2H are illustrations of a method of manufacturing a self-aligned bipolar transistor of an experiment of the invention.

As shown in FIG. 2A, an $SiO_2$ film 24 (first insulating film) 1000 angstroms thick is formed on an n-type silicon substrate 23 (semi-conductor substrate) by thermal oxidation, and on the $SiO_2$ film 24, a p$^+$-type silicon film 25 (first conductor film) having a thickness of 2600 angstroms and an $SiO_2$ film 26 (second insulating film) having a thickness of 4000 angstroms are formed in sequence by a CVD process.

Figure 2B:
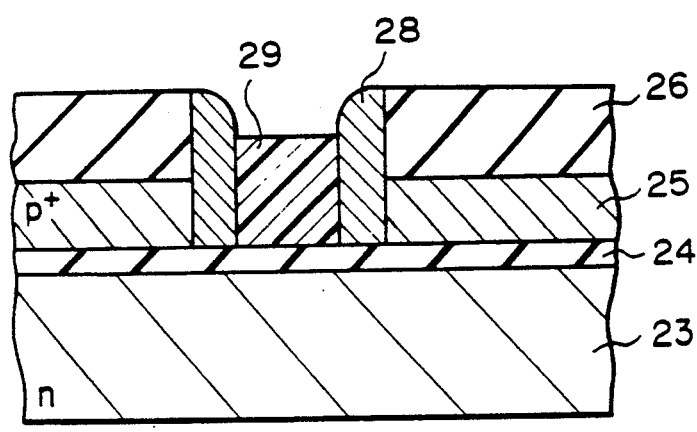

Subsequently, the SiO$_2$ film 26 and Si film 25 are successively and selectively etched using a resist film, not shown, as a mask, to thereby form a first hole 27 having a width of 1 micrometer. An aluminum film covering the hole 27 is formed by, e.g., a sputter process, and then anisotropically etched, to thereby leave the aluminum film 28 on the inside wall of the first hole 27 (FIG. 2B). As the material of the film 28, any material may be used that can be subsequently selectively etched in contrast with the insulating films 24 and 26, and the Si film 25, and has a masking property for the etching. For example, a material such as tungsten and CVD-Si$_3$N$_4$ may be used.

Figure 2C:
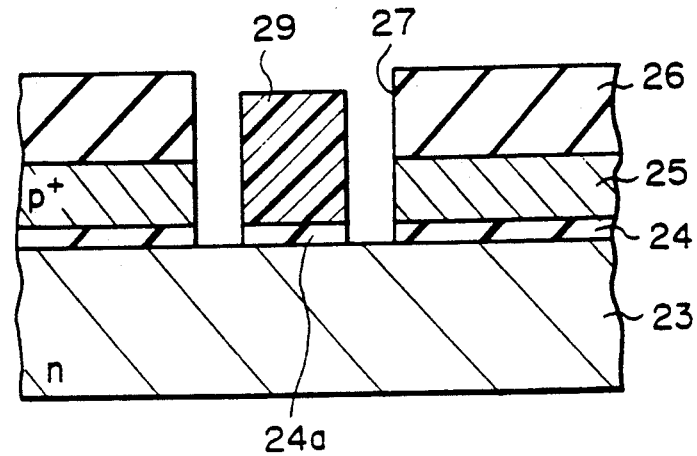

A resist film is then formed over the entire surface and etched back, to bury a resist film 29 inside the first hole 27 (FIG. 2B). The aluminum film 28 is then selectively etched by wet etching by HCl using the resist film 29 and the SiO$_2$ film 26 as a mask, and additionally, the SiO$_2$ film 24 and the Si film 25 are selectively etched by anisotropic etching, to thereby form an SiO$_2$ film 24a (third insulating film) on the silicon substrate 23 at the bottom of the first hole 27, separated from the inside wall of the hole 27 (FIG. 2C).

Figure 2D:
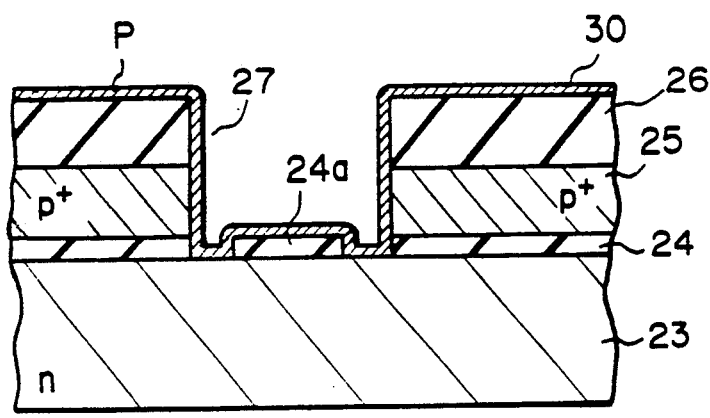

After removing the resist film 29, a p-type amorphous silicon film 30 (semiconductor film) of 200 angstroms in thickness is formed by a CVD process. At this time, the alpha-Si (amorphous silicon) film 30 is connected to the Si film 25 in the wall of the first hole 27 and the Si substrate 23 adjacent to the SiO$_2$ film 24a. By a subsequent heat treatment at a temperature of 600° C. for 24 hours, the Si film 30 in an amorphous state on the semiconductor substrate 23 of an Si single crystal is single-crystallized, and the single crystallization of the amorphous Si film 30 extending onto the SiO$_2$ film 24a simultaneously proceeds in the lateral direction utilizing the semiconductor substrate 23 as a seed, to thereby single-crystallize the portion of 0.1–0.3 micrometers from the edge of SiO$_2$ film 24a of the amorphous Si film 30 extending onto the film 24a (this process is called a lateral solid phase epitaxy). Any non-crystalline material as the semiconductor film 30, such as polysilicon as well as amorphous silicon, may also be single-crystallized in the similar way. Other portions of the Si film 30, i.e., the portion in contact with the Si film 25 in the wall of the first hole 27 and the portion spaced more than 0.1–0.2 micrometers from the edge of the SiO$_2$ film 24a, are polycrystallized (FIG. 2D).

Figure 2E:
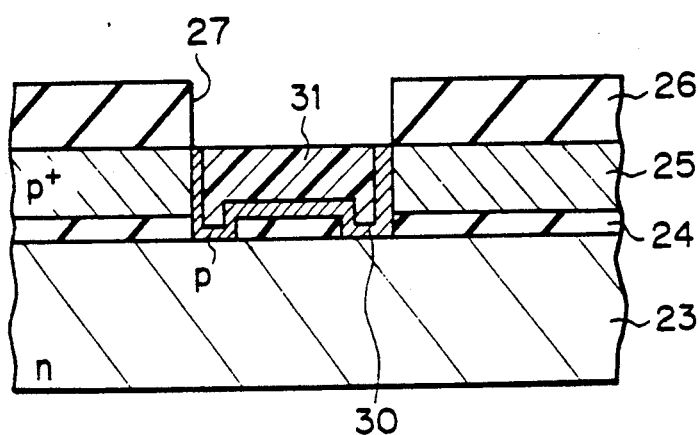

A resist film is then formed over the entire surface and etched back, to bury a resist film 31 inside the first hole 27, and using the film 31 as a mask, the Si film 30 is selectively etched, to thereby leave the Si film 30 at the bottom of the first hole 27. At this time, the Si film 30 remains in such a manner that it adjoins the Si layer 25 in the wall of the first hole 27 (FIG. 2E).

After removing the resist film 31, an SiO$_2$ film covering the first hole 27 and having a thickness of 2000–3000 angstroms is formed. It is required that the thickness of this SiO$_2$ film is at least thicker than that of the SiO$_2$ film 30. The formed SiO$_2$ film is then etched by anisotropic etching, the form a side wall 32 covering the Si film 30 on the wall of the first hole 27. Since the top end of the Si film 30 was previously formed at the position lower than the top of the insulating film 26, it is possible to form the side wall without allowing the top end of the Si film 30 to be exposed. A second hole 33 having inside walls of the SiO$_2$ film 32 (fourth insulating film) is thus formed (FIG. 2F).

Figure 2F:
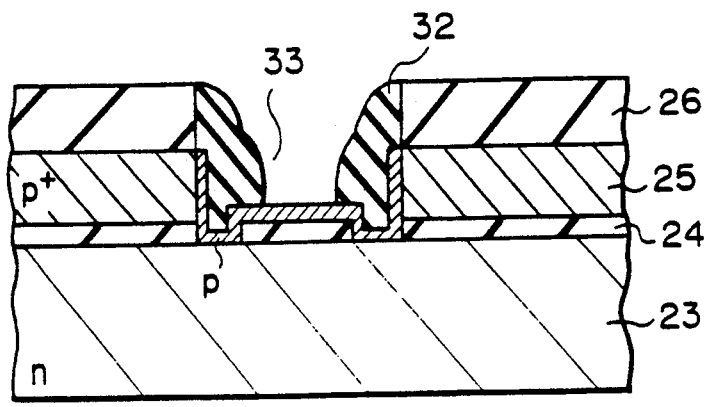
Figure 2G:
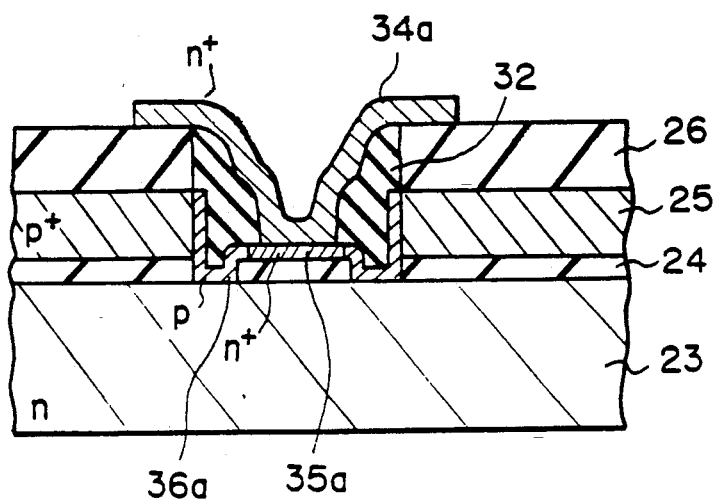

Subsequently, as shown in FIG. 2G, an emitter electrode 34a is formed that is connected to the Si film 30 at the bottom of the second hole 33 and consists of an n+-type polysilicon film (second conductor film). The Si film 30 is then doped with phosphorus or arsenic from the second conductor film 34a by heat treatment, and an n+-type emitter region 35a is formed in the Si film 30 on the SiO$_2$ film 24a.

To complete a bipolar transistor of the invention, a process for making base, emitter, and collector electrodes of metal such as that used for producing a prior transistor is successively carried out.

Figure 2H:
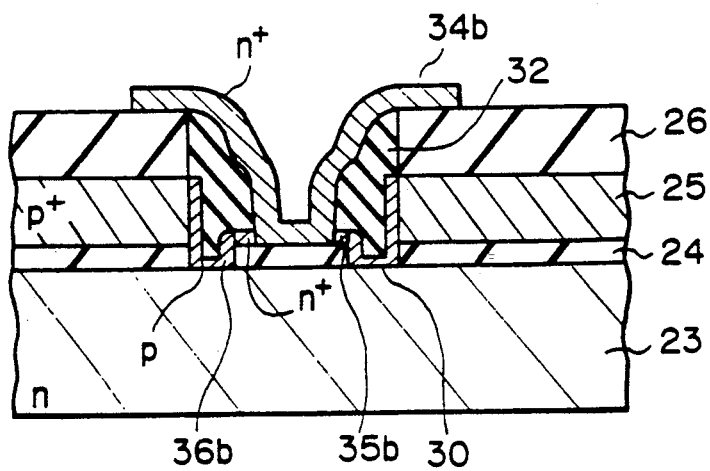

After the step illustrated in FIG. 2F, a process such as shown in FIG. 2H may also take place. In the alternative process, the Si film 30 at the bottom of the second hole 33 is selectively etched. A polysilicon film 34b (second conductor film) doped with conductive impurities of phosphorus or arsenic is formed, covering the second hole 33, and by a subsequent heat treatment, the Si film 30 on the SiO$_2$ film 24a is doped at the side thereof with the impurities to form an n+-type emitter region 35b.

In this way, in the first embodiment of the invention, junctions and regions in a bipolar transistor are self-alignedly formed without channeling because of ion implantation. Namely, a base region 36a between the emitter and the collector, which are constituted by the emitter electrode 34a on the SiO$_2$ film 24a and the Si substrate 23, is self-alignedly determined by the thickness of the SiO$_2$ film 24a and the hang-over width of the side wall SiO$_2$ film 32 hanging over the SiO$_2$ film 24a. Alternatively, a base region between an emitter and a collector, which are constituted by the Si layer 25 in the inside wall of the first hole 27 and the n+-type Si film 30 on the SiO$_2$ film 24a, is self-alignedly determined by the thickness of the side wall aluminum film 28 and the thickness of the Si film 30, and a base region between an emitter and a collector, which are constituted by the Si layer 25 in the wall of the first hold and the Si substrate 23, is self-alignedly determined by the SiO$_2$ film 24.

Also, areas of a collector/base junction and an emitter/base junction are determined by the thickness of the Si film 30 and the thickness of the Si layer 25. When a collector/base junction or emitter/base junction is formed between the Si substrate 23 adjacent to the SiO$_2$ film 24a and the Si film 30, the junction area is approximately determined by the thickness of the aluminum film 28 formed on the wall of the first hole 27 for forming the SiO$_2$ film 24a.

Thus, the reduction of the emitter region 35a, 35b, base region 36a, 36b, and collector region, and the formation of a shallow junction can be easily carried out.

Figure 1:
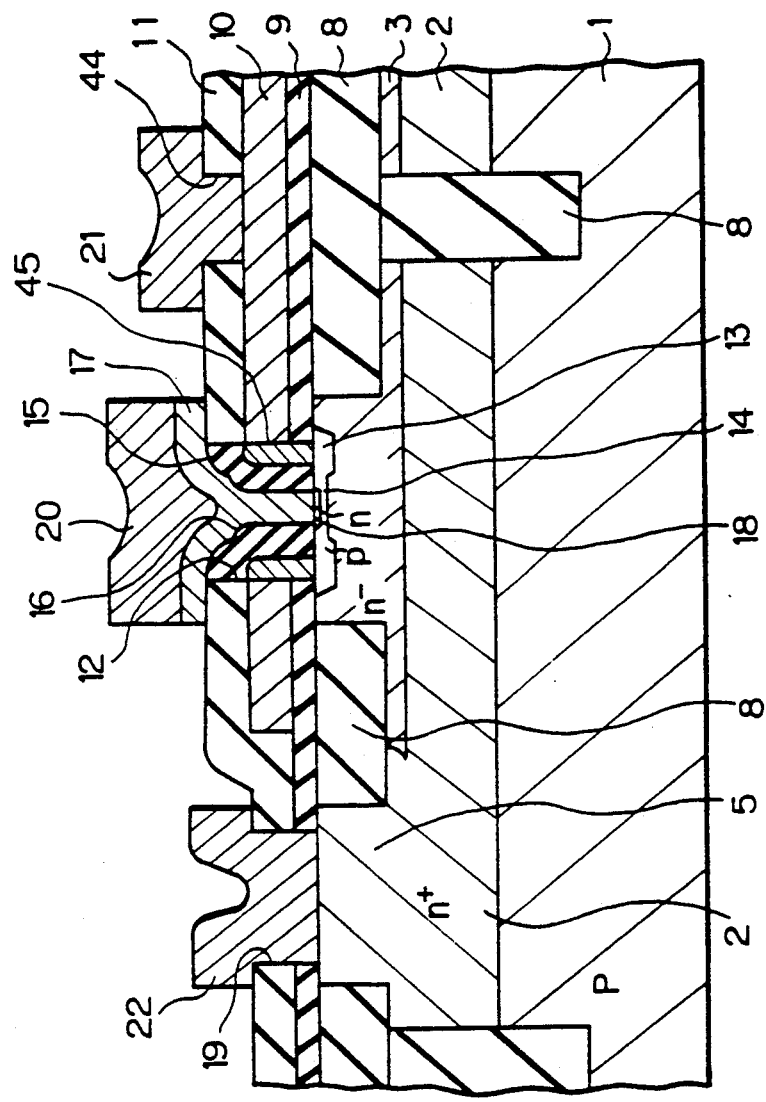
FIG. 1 is an illustration of a prior self-aligned bipolar transistor.

Characteristics of a bipolar transistor produced by removing a silicon film 30 at the bottom of the second hole 33 by a selective etching, as illustrated in FIG. 2H, are shown in Table 1 and compared with those of a prior bipolar transistor such as shown in FIG. 1. These characteristics were calculated assuming the following:

In the prior transistor, the first hole for forming an emitter is 1.0 micrometers wide and 3 micrometers long; the thickness of a polysilicon film on the side of the hole is 0.1 micrometers; the side wall thickness is 0.2 micrometers; the emitter opening width is 0.2 micrometers; and the distance between the outer end of an external base region and the end of an insulating film facing said outer end of the external base region is 0.5 micrometers. In the inventive bipolar transistor, the first hole for forming an emitter is 1 micrometer wide and 3 micrometers long; the width of a third insulating film at the bottom hole is 0.2 micrometers; the first insuling film thickness is 1000 angstroms; the first conductor film thickness is 2600 angstroms; and the silicon film (semiconductor film) thickness is 0.02 micrometers.

TABLE 1

|  | prior transistor | inventive transistor |
|---|---|---|
| emitter area | 0.6 μm² | 0.12 μm² |
| base area | 3.0 μm² | 0.76 μm² |
| base/emiiter capacitance $C_{EB}$ | 11.2 fF | 2.3 fF |
| base/collector capacitance $C_{CB}$ | 4.8 fF | 1.2 fF |
| base resistance $R_B$ | 880 Ω | 918 Ω |
| emitter resistance $R_E$ | 28 Ω | 29 Ω |
| $T_{pd}$ | 50 ps (ECL theoritical gate, at $I_{CS}$ = 0.3 mA) | 20 ps (ECL theoritical gate, at $I_{CS}$ = 0.3 mA) |

It can be seen from the above table, the emitter and the base areas of the inventive transistor are one fifth and one fourth of those of the prior transistor, respectively, and the substantial reduction in the capacitance between the base and the emitter and between the base and the collector is effected. The base resistance of the inventive transistor is about 4 percent higher than that of the prior transistor, and the emitter resistance in both transistors are nearly equal. An increase of 38 ohms in the base resistance of the inventive transistor results from the portions of the silicon film being in contact with the first insulating film exposed in the first hole wall and also in contact with the side of the third insulating film. As a result, the $T_{pd}$ in the inventive transistor is significantly shortened.

Figure 3A:
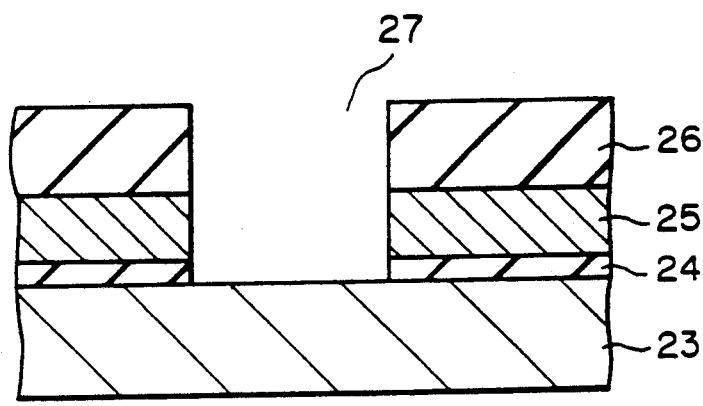
FIGS. 3A to 3D are illustrations of an alternative method of manufacturing the transistor shown in FIGS. 2A-2H.
Figure 3B:
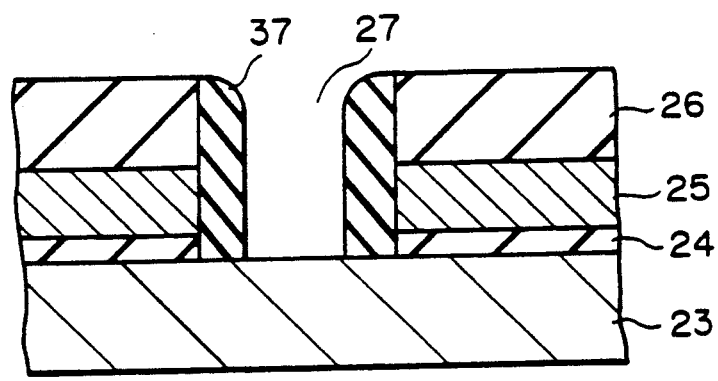
Figure 3C:
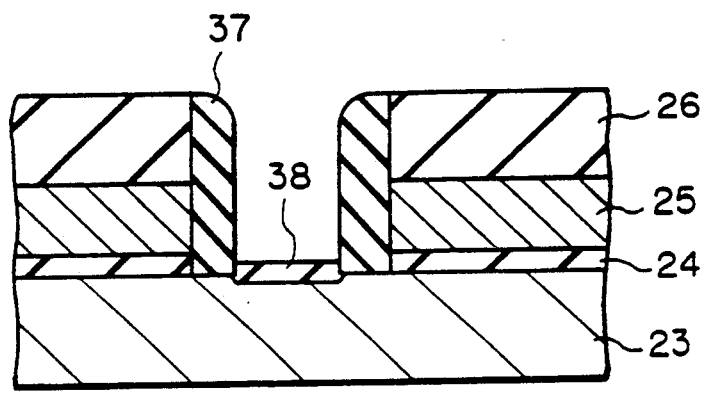
Figure 3D:
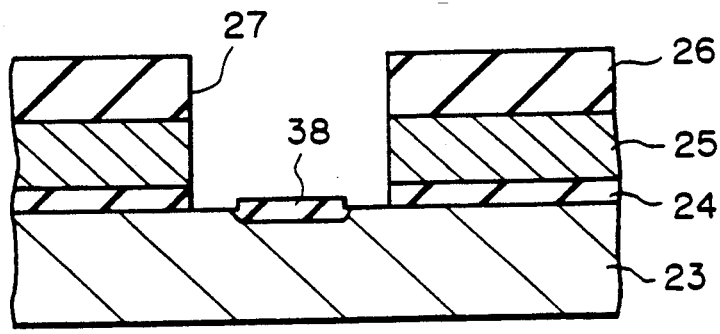

To form the condition of FIG. 2C, the following steps illustrated in FIGS. 3A to 3D may take place:

After the step in FIG. 2A, the SiO₂ film 24 (first insulating film) is further removed to expose the Si substrate 23, as shown in FIG. 3A. A silicon nitride, Si₃N₄, film covering a first hole 27 is then formed by a CVD process, in place of the aluminum film 28, and by a subsequent anisotropic etching, the Si₃N₄ film 37 is left on the inside wall of the first hole 27, as shown in FIG. 3B. Subsequently, the Si substrate 23 at the bottom of the hole having the inside wall of the Si₃N₄ film 37 is selectively oxidized, to thereby form an SiO₂ film 38 (third insulating film) having a thickness of 1000 angstroms, as shown in FIG. 3C. By a subsequent selective removal of the Si₃N₄ film 37 using phosphoric acid, the condition corresponding to that of FIG. 2C is created, as shown in FIG. 3D.

There are some possible variations in the thickness of a deposited amorphous silicon film relative to the width of an exposed Si substrate surface; the portion of amorphous silicon to be single-crystallized, and the emitter diffused region to be formed.

Figure 4A:
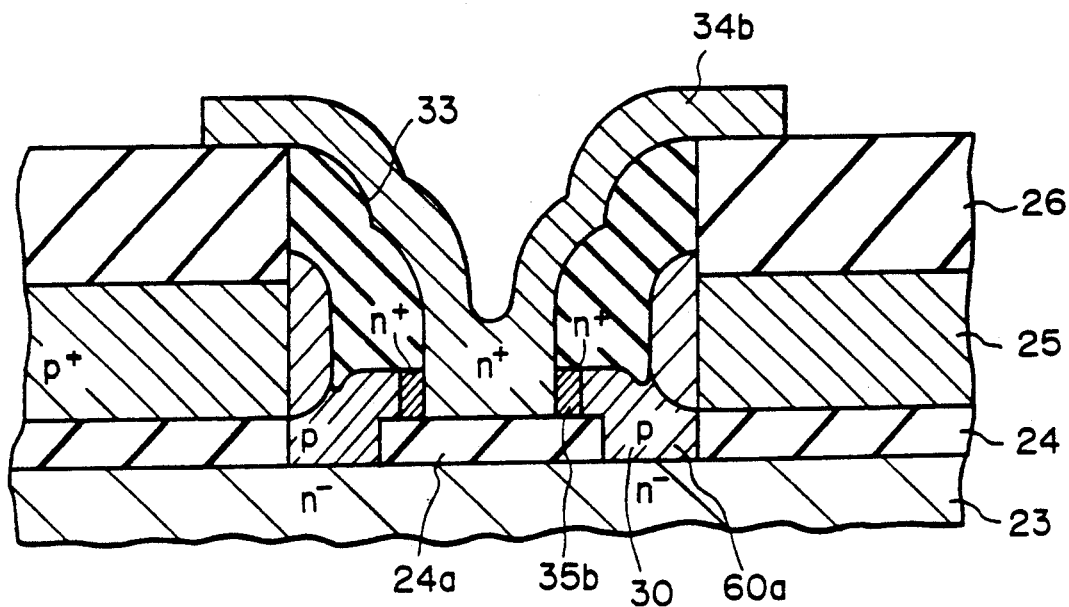
FIGS. 4A to 4C schematically show variations in amorphous and single-crystallized regions in a semiconductor film of a larger thickness relative to the width of an exposed semiconductor substrate.
Figure 4B:
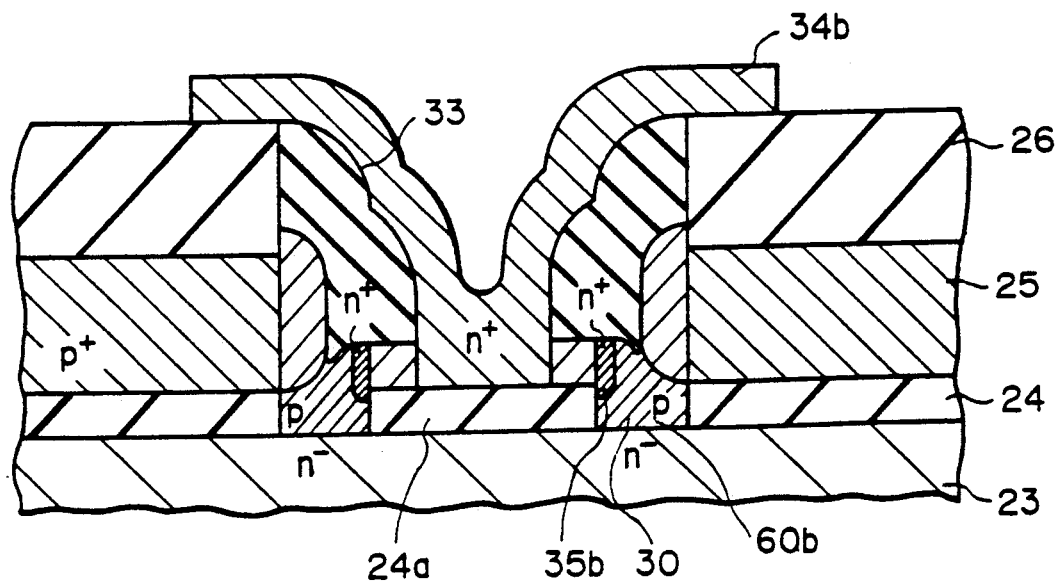
Figure 4C:
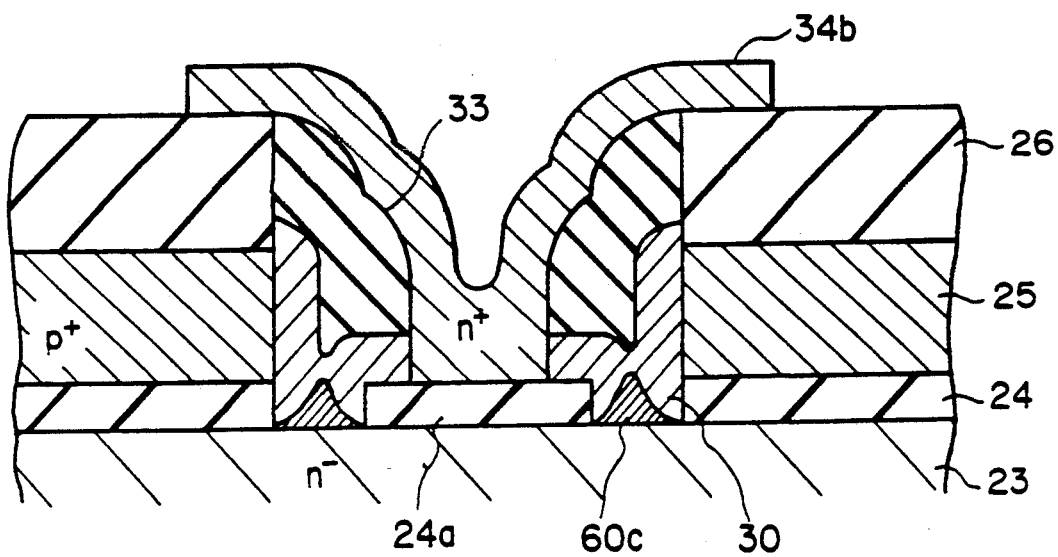

First, examples of an amorphous silicon film being thick relative to the width of an exposed Si substrate surface are described, referring to FIGS. 4A to 4C. In these drawings, the same items as in FIG. 2H are indicated by the same reference numerals.

In FIG. 4A, a single-crystallized region 60a of Si film extends to the end of the Si film located on a third insulating film 24a. Although the silicon film at the bottom of a second hole 33 may be left thereat, the silicon film at the second hole bottom is removed in this example, because if there is a silicon film of single crystal at the second hole bottom, the formation of a diffused region homogeneous in the lateral direction is difficult since single crystal silicon has a diffusion coefficient two or three orders lower than that of polycrystal silicon. When the silicon film at the bottom of the second hole 33 is removed, an emitter having uniformity is easily and conveniently formed, because impurities are uniformly introduced into the emitter polysilicon opening at the second hole bottom because of a high diffusion coefficient thereof, and are uniformly diffused in the lateral direction to form the emitter.

In FIG. 4B, although the single crystallization of silicon does not reach the site 35b where an emitter is to be formed, the polycrystalline region remaining between the region of the single crystallized silicon 60b and the emitter forming region 35b is fully separated from the polycrystalline silicon connected to a first conductor film 25 for a base electrode. The impurities from the second conductor film 34b are introduced up to the interface between the polycrystalline region 35b and the single crystal region 60b because of the high diffusion coefficient of polysilicon, to thereby form the emitter diffused region 35b.

In FIG. 4C, single crystallization does not extend to the level illustrated in FIG. 4B, i.e., it is limited in the site 60c directly in contact with a single crystal substrate 23, and the continuous region of polysilicon remains from the emitter side to the base side. Accordingly, when impurities are diffused from a second conductor film 34b to form an emitter diffused region, a leakage current occurs between the base and the emitter. In such a case, the leakage current may be suppressed by a thin layer of amorphous silicon, as described later referring to FIG. 5C.

Figure 5A:
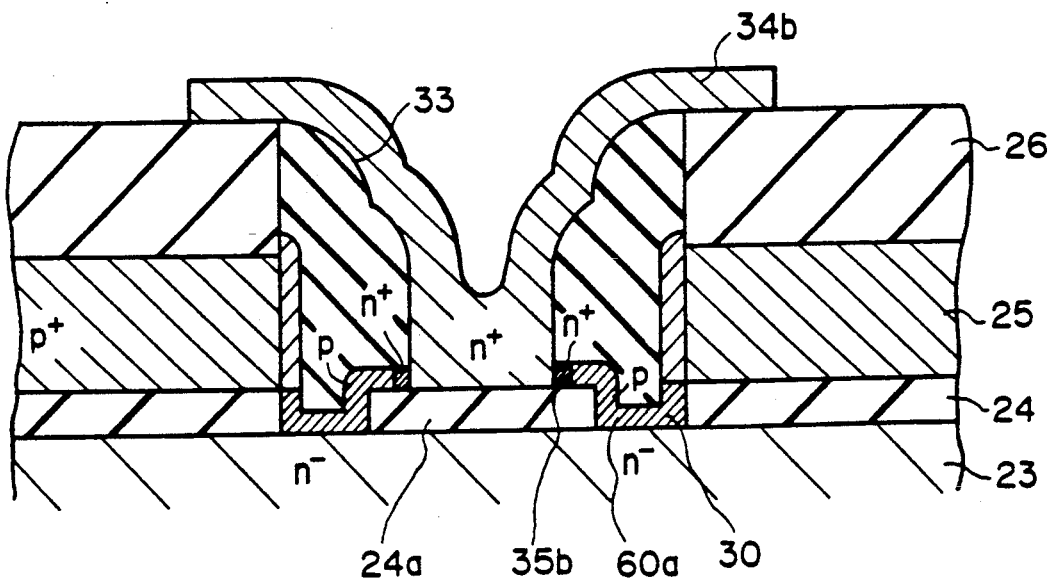
FIGS. 5A to 5C schematically show variations in amorphous and single-crystallized regions in a thinner semiconductor film relative to the width of an exposed semiconductor substrate.
Figure 5B:
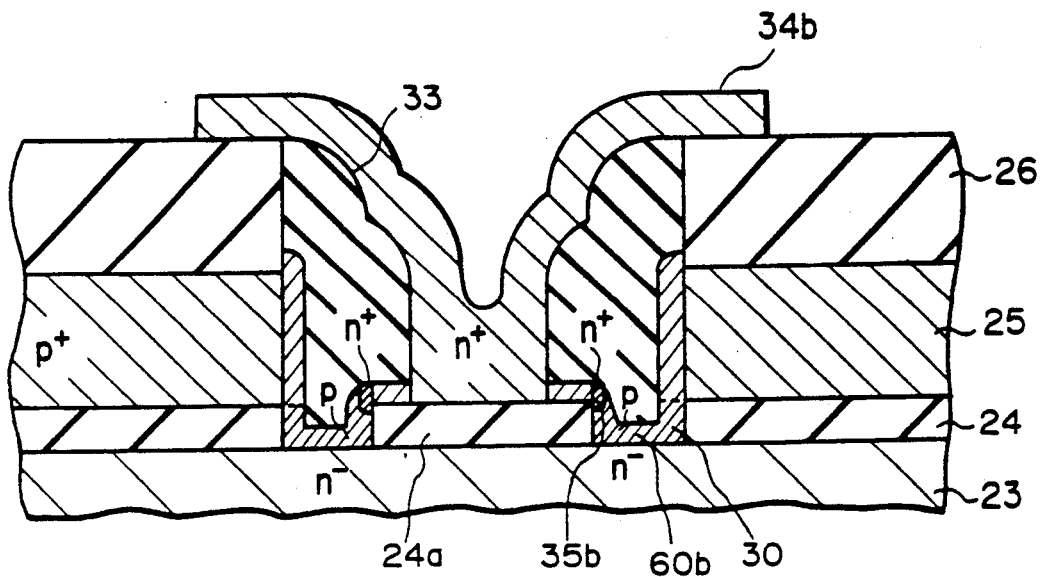
Figure 5C:
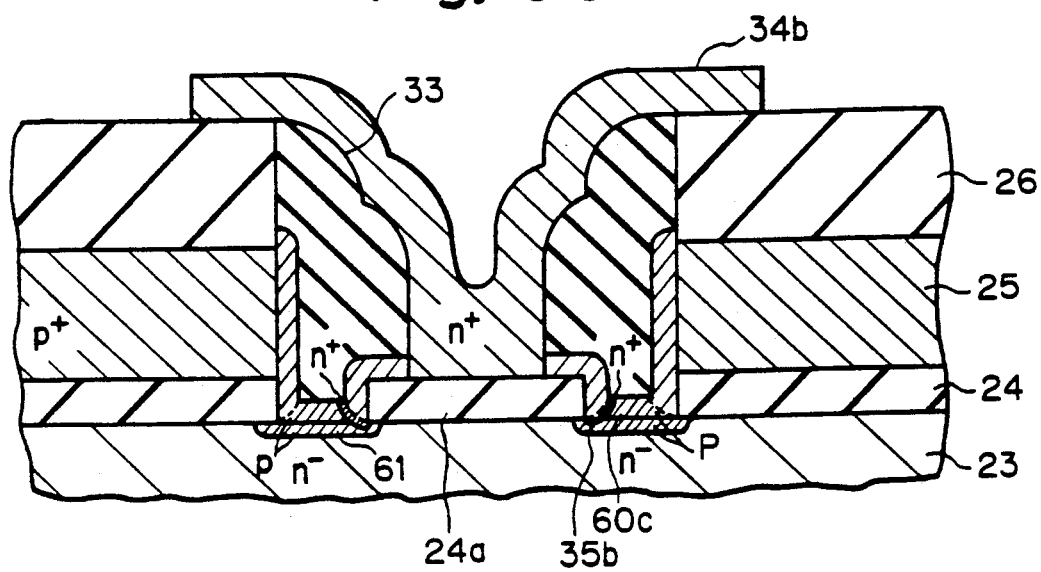

Examples of an amorphous silicon film being thin relative to the width of an exposed silicon substrate surface are now described, referring to FIGS. 5A to 5C. In these drawings, the same items as in FIG. 2H are also indicated by the same reference numerals.

Although FIG. 5A is similar to FIG. 4A, a semiconductor film 30 in FIG. 5A is thinner than that in FIG. 4A. Since the distance between a base and an emitter can be larger, it is easy to reduce the leakage current between the base and the emitter, and the withstand voltage between the base and the emitter can be larger.

Also, although FIG. 5B is similar to FIG. 4B, a semiconductor film 30 in FIG. 5B is thinner than that in FIG. 4B. Since a single crystal region 60b does not extend to the region in which an emitter is to be formed, impurities from a second conductor film 34b are diffused into the polysilicon to thereby form an emitter diffused region.

In FIG. 5C, although the degree of extension of a single crystal region 60c is similar to that in FIG. 4C, a leakage current can be suppressed because of a thin semiconductor film 30. In this case, the semiconductor film 30 is less thick relative to the exposed Si substrate surface, and the continuity of polysilicon from an emitter to a base electrode is avoided, and therefore, the increase of leakage current between the base and the emitter can be prevented. The interface, which is located between the polycrystal and the single crystal and is in contact with the silicon substrate 23, causes an increase in leakage current or a short circuit between the emitter and a collector. Thus, it is necessary that a base diffused region 61, more or less intruding into the substrate 23, is formed to thereby prevent impurities from piercing the base diffused region at the formation of an emitter diffused region.

The depth of a base is determined by the sum of the thickness of a third insulting film 30 and the amount of hang-over of a fourth insulating film 32. The amount of hang-over is not determined by lithography technology, but by the difference in the thickness of the film 28 formed in the step illustrated by FIG. 2B and the sum of the semiconductor film thickness in FIG. 2D and the fourth insulating film thickness in FIG. 2F. The amount of hang-over is thus determined and self-aligned, and the amount is therefore determined according to the accuracy of the film thickness at the formation thereof.

For example, in the case of the third insulating film thickness of 500 angstroms and a hang-over of 500 angstroms, a base depth of 1000 angstroms can be realized to obtain a thin base. When the third insulating film thickness and the amount of hang-over are further reduced, it is possible to obtain a shallower base than that formed by ion implantation.

Figure 6A:
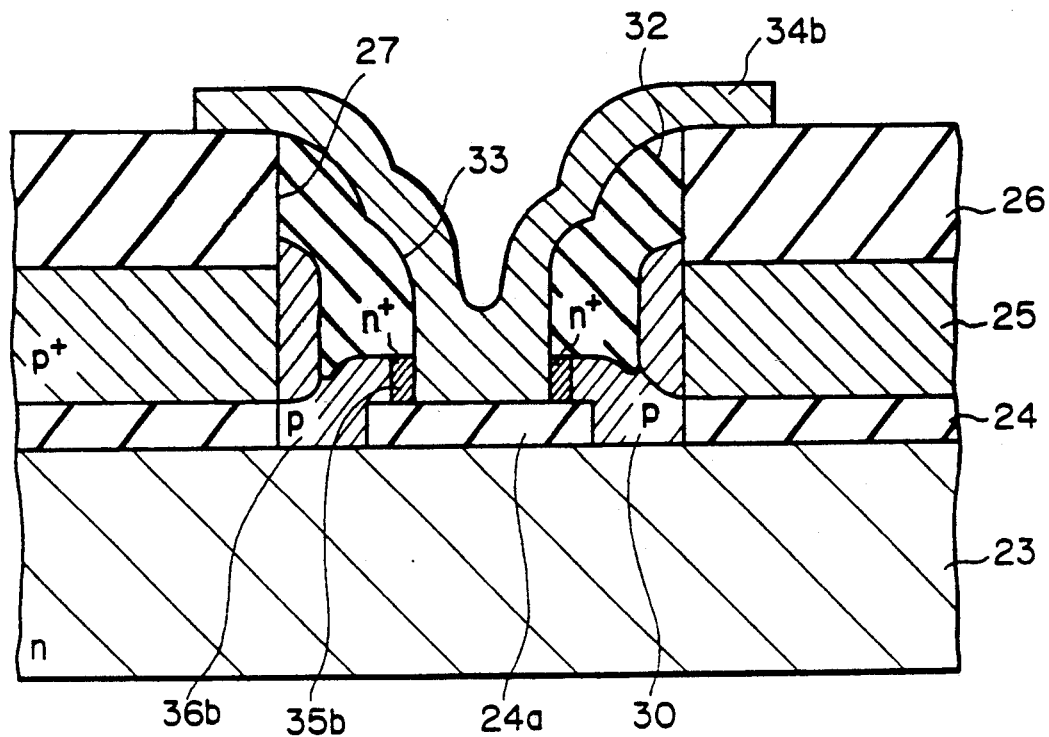
FIGS. 6A and 6B partly illustrate in detail self-aligned bipolar transistors produced in the step of FIG. 2H.
Figure 6B:
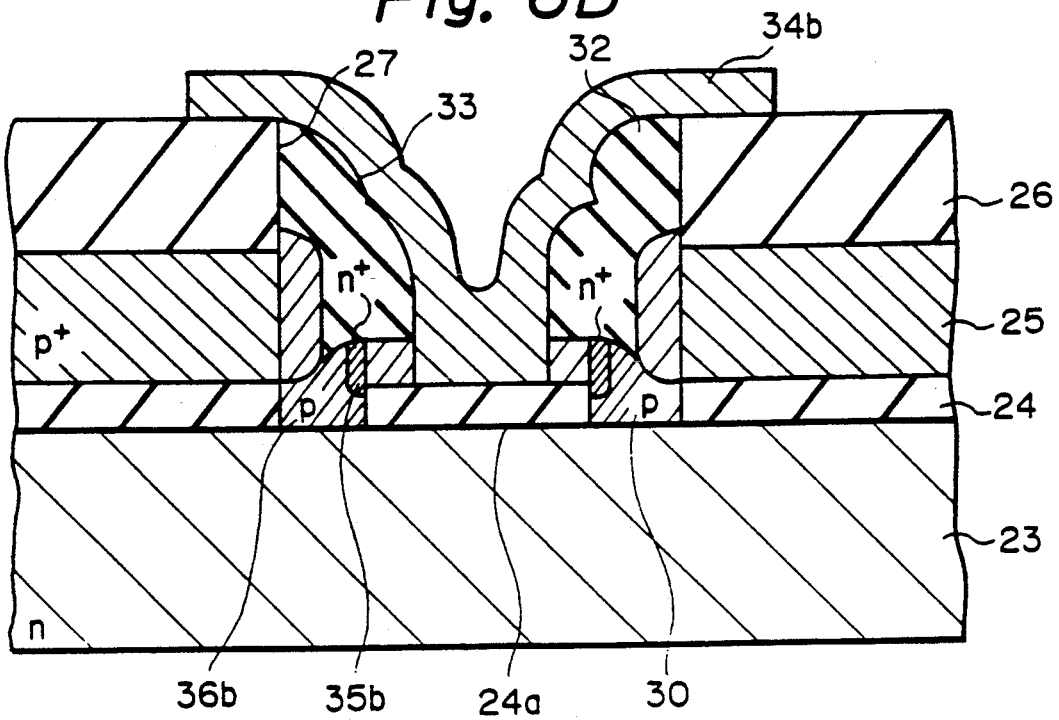

FIGS. 6A and 6B show in detail the self-aligned bipolar transistors produced in the step of FIG. 2H.

In FIG. 6A, the single crystallization of silicon of a semiconductor film 30 having been amorphous at the formation of the film extends to at least a portion of the film 30 to be removed on an $SiO_2$ film 24a (third insulating film). By removing the Si film (semiconductor film) on the $SiO_2$ film 24a and at the bottom of a second hole 33, a polycrystallized Si film does not remain on the $SiO_2$ film 24a. The portion of Si film 30 being connected to a first conductor film 25 of silicon is polycrystallized.

In FIG. 6B, silicon of a semiconductor film 30 having been amorphous at the formation of the film remains on an $SiO_2$ film 24a (third insulating film) not as a single crystal but as a polycrystal. By removing the semiconductor Si film on the $SiO_2$ film 24a and at the bottom of a second hole 33, portions of the polycrystallized Si film still remain on the $SiO_2$ film 24. The portion of Si film 30 being connected to a first conductor film 25 of silicon is also polycrystallized. Since the polycrystallized silicon has a higher diffusion coefficient compared with the single-crystallized silicon, an emitter region 35b may be formed closer to an Si substrate 23 in comparison with that illustrated in FIG. 6A.

Although in the above examples, a semiconductor film 30 of silicon that is initially deposited as a amorphous silicon film is used, and subsequently, at least the portion to be formed into a base region 36b is single-crystallized by low temperature annealing, the single crystallization of silicon may be performed by an initial deposition of polycrystalline silicon and a subsequent recrystallization thereof by laser irradiation. Alternatively, in some applications such as those in which a high speed operation is not requested, single crystallization is not always required, and an amorphous or polycrystalline film as such may be used.

Also, although in the above examples, an Si film 30 is doped with p-type impurities at the deposition thereof, impurities may be introduced into a non-doped amorphous or polycrystalline silicon film by ion implantation or gas diffusion after the formation of the film. Moreover, the material of a semiconductor film 30 is not limited to silicon, and other materials, such as Ge, SiGe, and SiC, may be utilized.

In the case of FIG. 6A and FIG. 6B, there is present an $SiO_2$ film 24a located at the bottom of a first hole 27 and separated from the inside walls of the hole 27, and an Si film 30 divided into an $n^+$-type emitter region 35b and a p-type base region 36b; the emitter region 35b being connected to a polysilicon film 34b (second conductive film) as an emitter electrode on the $SiO_2$ film 24a, and the base region 36b being connected to the $n^+$-type emitter region 35b and to an Si layer 25 such as a base electrode interposed between $SiO_2$ films 24, 26, and an Si substrate 23 as a collector region, adjacent to the $SiO_2$ 24a. Thus, the interface between the $n^+$-type and p-type regions formed on the $SiO_2$ film 24a makes an emitter/base junction, and the interface between the Si substrate 23 and the p-type Si film 30 makes a collector/base junction.

Consequently, since the entire bottom of a first hole 27, which has determined the area of a collector/base junction in a prior art device, is not employed as a collector/base junction in the present invention, the area of a collector/base junction in the invention can be greatly reduced. Also, since the area of an emitter/base junction is determined by the thickness of Si film 30, it can be greatly reduced compared with the prior cases. In this way, the reduction of parasitic capacitance can be effected. Furthermore, although the emitter/base junction area in the above examples is decreased even when compared with prior devices in which it is presumed that the entire emitter/base junction does not operate because of the emitter crowding effect, an acceptable maximum current in the above examples operating in the entire junction is not reduced.

Thus, an emitter region 35b is formed inside an Si film 30 (semiconductor film) in the above embodiments. Alternatively, the interface between an Si film 30 and a second conductor film 34b formed of an Si film (semiconductor film) of a type of conduction (n-type) may be used as an emitter/base junction. In such a case, it is also possible to make a heterobipolar transistor (HBT), using, as the Si film 30 (semiconductor film) and the second conductor film 34b, materials different in band gap, for example, using SiGe for the former and Si for the latter, or Si for the former and SiGe for the latter. As a result, it is possible to make a much higher speed transistor.

Figure 7A:
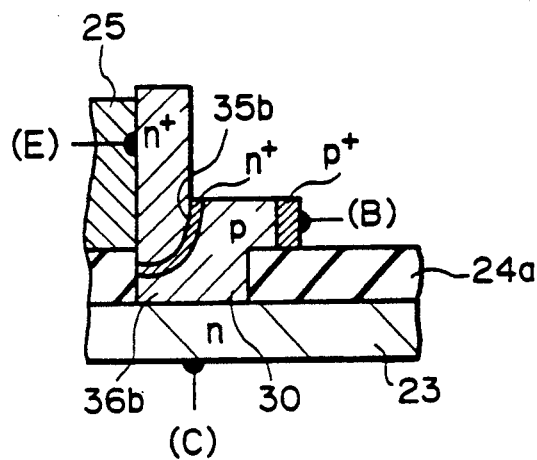
FIGS. 7A and 7B partly show further self-aligned bipolar transistors of the invention.
Figure 7B:
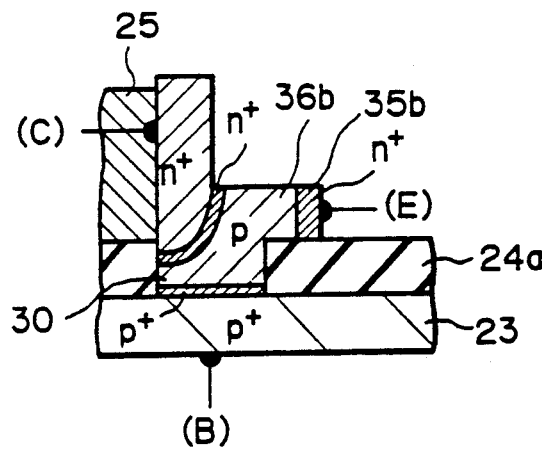

FIGS. 7A and 7B partly show additional self-aligned bipolar transistors of the invention.

The difference of the embodiment of FIG. 7A from those of FIGS. 6A and 6B is the use of a polysilicon film (second conductor film), not shown, connected to a silicon film 30 (semiconductor film) on an $SiO_2$ film 24a (third insulating film) as a base electrode, and the use of the Si film 30 between an emitter and a collector, which are constituted by an Si layer 25 (first conductor film) and an Si substrate 23 (semiconductor substrate) as a base region 36b.

The difference of the embodiment of FIG. 7B from those of FIG. 6A and 6B is the use of a silicon substrate 23 (semiconductor substrate) as a base electrode, and the use of a silicon film 30 (semiconductor film) between an emitter and a collector, which are constituted by a polysilicon film (second conductor film), not shown, connected to the silicon film 30 on an $SiO_2$ film 24a (third insulating film) and a silicon layer 25 (first conductor film) as a base region 36b.

In the embodiments illustrated in FIGS. 7A and 7B, effects similar to those in the embodiments in FIGS. 6A and 6B can be obtained.

Figure 8A:
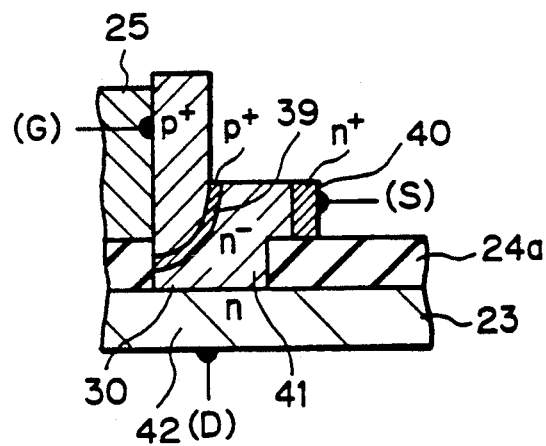
FIGS. 8A to 8C partly show static induction transistors provided with a diffused gate of the invention.
Figure 8B:
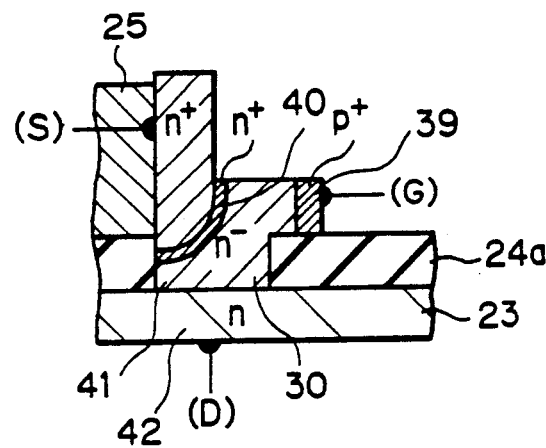
Figure 8C:
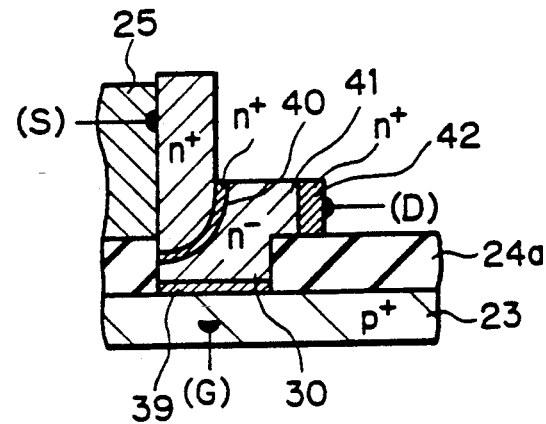

Referring to FIGS. 8A to 8C, static induction transistors (SITs) provided with a diffused gate of embodiments of the invention are described.

In FIG. 8A, a silicon substrate 23 (semiconductor substrate) adjacent to an SiO$_2$ film 24a (third insulating film) is an n-type drain region 42, a polycrystalline portion of a silicon film 30 (semiconductor film) connected to a silicon layer 25 (first conductor film) and a portion of the single crystal of the film 30 adjacent to the polycrystalline portion represent a diffused P$^+$-type gate region 39; a part of the Si film 30 connected to a source electrode (second conductor film), not shown, represents an n$^+$-type source region 40, and the n$^-$-type silicon film 30 between the drain region 42 and the source region 40 is a channel region 41.

In FIG. 8B, a silicon substrate 23 (semiconductor substrate) adjacent to an SiO$_2$ film 24a (third insulating film) is an n-type drain region 42, a polycrystalline portion of a silicon film 30 (semiconductor film) connected to a silicon layer 25 (first conductor film) and a portion of the single crystal of the film 30 adjacent to the polycrystalline portion represent an n$^+$-type source region 40, a part of the Si film 30 connected to a gate electrode (second conductor film), not shown, is a diffused P$^+$-type gate region 39, and the n$^-$-type silicon film 30 between the drain region 42 and the source region 40 is a channel region 41.

In FIG. 8C, a portion of a silicon film 30 (semiconductor film) adjoining a silicon substrate 23 (semiconductor substrate) is a diffused n$^+$-type gate region, a polycrystalline portion of the silicon film 30 connected to a silicon layer 25 (first conductor film) and a portion of the single crystal of the film 30 adjoining the polycrystalline portion represent an n$^+$-type source region 40, a part of the Si film 30 connected to a drain electrode (second conductor film), not shown, is an n$^+$-type drain region 42, and the n$^-$-type silicon film 30 between the drain region 42 and the source region 40 is a channel region 41.

In these SITs, a depletion layer is spread into a channel region 41 by a reverse bias to a diffused gate region, and a current between a drain and a source is controlled by adjusting a sectional area through which the current passes.

These SITs have a structure similar to those of the bipolar transistors illustrated in FIGS. 6A and 6B, and it is possible to miniaturize the diffused gate, source, and drain regions thereof, and accordingly, the reduction of a parasitic capacitance can be effected. It is possible to shorten the length of a channel region 41, since said length is determined by factors such as the thickness of SiO$_2$ film 24, 24a. Therefore, a higher speed operation can be realized, and an acceptable maximum current sufficient for a given device can be held.

Figure 9A:
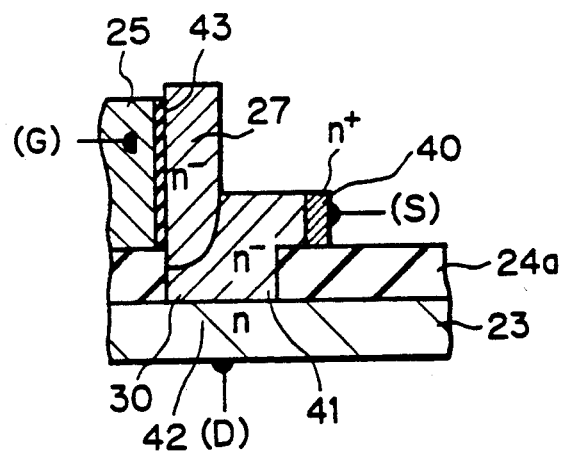
FIGS. 9A to 9C partly show static induction transistors provided with an insulation gate of the invention.
Figure 9B:
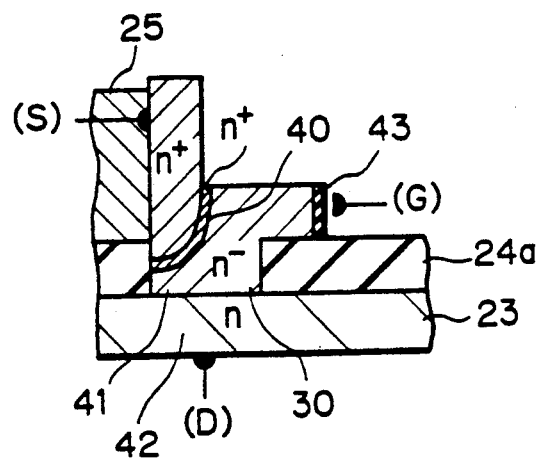
Figure 9C:
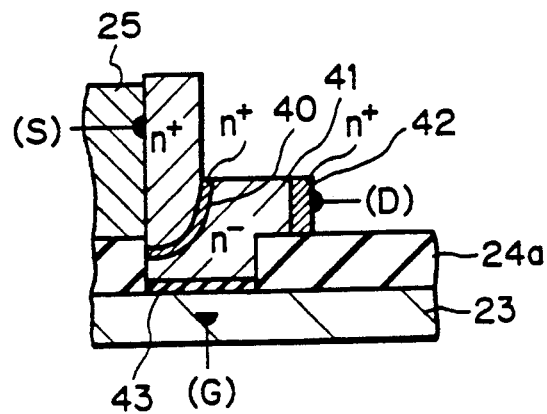

Referring to FIGS. 9A to 9C, static induction transistors provided with an insulation gate of embodiments of the invention are described. The difference of these embodiments from those of FIGS. 8A to 8C is that, in place of a diffused gate, a gate insulation film 43 is formed at a location similar to that of the diffused gate.

In FIG. 9A, a gate insulating film 43 is formed between a silicon layer 25 (first conductor film) as a gate electrode and a silicon film 30 (semiconductor film). In this case, the portion of the Si film 30 adjacent to the gate insulation film 43 remains n$^-$-type polycrystal. A silicon substrate 23 (semiconductor substrate) adjacent to an SiO$_2$ film 24a (third insulating film) is a drain region 42; the portion of the Si film 30 connected to a source electrode (second conductor film), not shown, is an n$^+$-type source region 40, and the portion of the Si film 30 between the drain region 42 and the source region 40 is a channel region 41.

In FIG. 9B, a gate insulation film 43 is formed between a gate electrode (second conductor film), not shown, and a silicon film 30 (semiconductor conductor film). A silicon substrate 23 (semiconductor substrate) adjacent to an SiO$_2$ film 24a (third insulating film) is an n-type drain region 42, the portion of the polycrystal connected to an Si layer 25 (first conductor film) and the portion of the single crystal adjacent thereto of the silicon film 30 represent an n$^+$-type source region 40, and the portion of the n$^-$-type silicon film 30 between the drain region 42 and the source region 40 is a channel region 41.

In FIG. 9C, a gate insulation film 43 is formed between a silicon substrate 23 (semiconductor substrate) as a gate electrode adjacent to an SiO$_2$ film 24a (third insulating film) and a silicon film 30 (semiconductor film). The portion of the polycrystal connected to a silicon layer 25 (first conductor film) and the portion of the single crystal adjacent thereto of the silicon film 30 represent an n$^+$-type source region 40, and the portion of the Si film 30 connected to a drain electrode (second conductor film), not shown, is a drain region 42, and the portion of the n$^-$-type Si film 30 between the drain region 42 and the source region 40 is a channel region 41.

In these static induction transistors provided with an insulation gate, a depletion layer is spread into a channel region 41 by the application of voltage to a gate electrode, and the current between a drain and a source is controlled by adjusting a sectional area through which the current passes.

In these SITs, it is also possible to miniaturized the source and drain regions, and a gate connecting portion, as illustrated in FIGS. 8A to 8C, and the reduction of a parasitic capacitance can therefore be effected. Moreover, it is possible to make a high speed transistor because of the possibility of shortening the channel region.

The above static induction transistors can be easily produced using the method of the present invention.

For example, a static induction transistor having a structure shown in FIG. 9A may be produced as follows:

After the step illustrated in FIG. 2C, the resist film 29 is removed. Oxidized film are then formed on the silicon layer 25 (first conductor film) exposed in the wall of the first hole 27 and on the silicon substrate 23 (semiconductor substrate) adjacent to the SiO$_2$ film 24a (third insulating film). By subsequent anisotropic etching, only the oxidized films on the silicon substrate 23 are removed, and the oxidized films on the wall of the first hole 27 are left, to thereby form a gate insulation film 43. The remaining steps illustrated in FIGS. 2D to 2F and 2H are then carried out.

Also, an SIT having a structure shown in FIG. 9B may be made as follows:

After the step illustrated in FIG. 2F, the silicon film 30 (semiconductor film) at the bottom of the second hole 33 is removed. A gate insulation film is subsequently formed on the side of the silicon film 30 exposed on the wall of the second hole 33 by thermal oxidation. A polysilicon film (second conductor film) as a gate electrode is then formed, covering the second hole 33, to thereby obtain the structure of the insulation gate SIT shown in FIG. 9B.

I claim:

1. A method of manufacturing a semiconductor device, comprising the following steps:
   on a semiconductor substrate surface at the bottom of a hole that goes through three layers of a first insulating film formed on the substrate, a first conductor film formed on the first insulating film, and a second insulating film formed on the first conductor film, and reaches the substrate surface, forming a third insulating film separated from the inside walls of the hole;
   forming a semiconductor film covering the bottom of the hole and the first insulating and the first conductor films in the walls of the hole;
   forming a fourth insulating film covering the inside walls of the hole in such a way that a part of the semiconductor film on the third insulating film is exposed; and
   forming a second conductor film being connected to the exposed semiconductor film.

2. The method according to claim 1, comprising the following steps between the steps of forming the third insulating film and forming the semiconductor film:
   forming a fifth insulating film on the surface of the first conductor film exposed on the inside wall of the hole and the surface of the semiconductor substrate adjacent to the third insulating film; and
   removing the fifth insulating film on the surface of the semiconductor substrate adjacent to the third insulating film by anisotropic etching.

3. The method according to claim 1, comprising the following steps after the step of forming the second hole:
   etching and removing the exposed semiconductor film using the fourth insulating film as a mask; and
   forming a second conductor film connected to the semiconductor film.

4. The method according to claim 1, wherein a part of the semiconductor film having been formed in a non-crystalline state is single-crystallized using the semiconductor substrate of single crystal as a seed.

* * * * *

UNITED STATES PATENT AND TRADEMARK OFFICE
CERTIFICATE OF CORRECTION

PATENT NO. : 5,290,716
DATED : March 1, 1994
INVENTOR(S) : Shunji NAKAMURA

It is certified that error appears in the above-indentified patent and that said Letters Patent is hereby corrected as shown below:

Title Page - Item 56, 4th entry, "Hamagasaki" should be --Hanagasaki--;

Column 1, line 6, "07/71,746" should be --07/911,746--;

line 26, "n-type" should be --$n^+$-type--.

Column 11, line 46 "a" should be --an--.

Signed and Sealed this

Seventeenth Day of December, 1996

Attest:

BRUCE LEHMAN

Attesting Officer    Commissioner of Patents and Trademarks